United States Patent [19]
Hirofuji et al.

[11] Patent Number: 5,781,719
[45] Date of Patent: Jul. 14, 1998

[54] SEMICONDUCTOR DISK DEVICE HAVING A LARGE CAPACITY OF QUICK-ACCESS MEMORY AND HARD DISK FOR BACKUP AND ITS DATA STORAGE METHOD

[75] Inventors: Susumu Hirofuji; Hiroyuki Kaneko; Tadashi Yoneyama, all of Tokyo, Japan

[73] Assignee: Kabushiki Kaisha Toshiba, Kawasaki, Japan

[21] Appl. No.: 682,166

[22] Filed: Jul. 17, 1996

[30] Foreign Application Priority Data

Jul. 20, 1995 [JP] Japan .................................. 7-184288

[51] Int. Cl.[6] .................................................. G06F 11/00
[52] U.S. Cl. ............................. 395/182.12; 395/183.2
[58] Field of Search ........................ 395/182.12, 182.03,
395/182.04, 182.05, 182.2, 183.18, 184.01,
750, 183.2, 182.06, 183.21, 185.07; 364/492,
187; 365/228, 229, 52, 201; 371/40.15

[56] References Cited

U.S. PATENT DOCUMENTS

| | | | |
|---|---|---|---|
| 4,908,793 | 3/1990 | Yamagata et al. | 365/52 |
| 4,959,774 | 9/1990 | Dvais | 364/200 |
| 5,204,963 | 4/1993 | Noya et al. | 395/750 |
| 5,317,752 | 5/1994 | Jewett et al. | 395/750 |
| 5,414,861 | 5/1995 | Horning | 395/750 |
| 5,488,731 | 1/1996 | Mendelsohn | 395/800 |
| 5,557,738 | 9/1996 | Townsley et al. | 395/183.12 |
| 5,617,532 | 4/1997 | Ushiyama | 395/183.12 |

*Primary Examiner*—Robert W. Beausoliel, Jr.
*Assistant Examiner*—Nadeem Iqbal
*Attorney, Agent, or Firm*—Oblon, Spivak, McClelland, Maier & Neustadt, P.C.

[57] ABSTRACT

A semiconductor disk device for storing or outputting data in accordance with a write request from an outer unit or a read request comprising a volatile memory for writing input data from the outer unit and for storing data to be read in the outer unit, a battery for supplying power to the semiconductor disk device when a power supply of the semiconductor disk device is interrupted, a nonvolatile storage outputting initially stored data to the volatile memory when the power supply is input, and operating with power supplied from the battery when the power supply is interrupted, thereby storing data stored in the volatile memory to save the stored data, a detecting section for detecting whether or not the battery can supply power, and a write-through setting section for changing a write-path of the input data from the outer unit to a write-through path where the input data is written onto not only the volatile memory but also the nonvolatile storage means when it is detected by the detecting means that the battery cannot supply power.

21 Claims, 8 Drawing Sheets

▶ DATA READ PATH (HDD READ PATH)

SEMICONDUCTOR DISK DEVICE HAVING A LARGE CAPACITY OF QUICK-ACCESS MEMORY AND HARD DISK FOR BACKUP AND ITS DATA STORAGE METHOD

BACKGROUND OF THE INVENTION

1. Field of the Invention

The present invention relates to a semiconductor disk device, used for storage in a computer system, in which data reading/writing operations for data savings are improved at the time of failure of a battery.

2. Description of the Related Art

There has been required a quick-access storage, which has a large capacity and which is capable of operating at high speed, in accordance with the development of a computer technique.

A semiconductor disk device comprises a quick-access volatile memory section having a large capacity and a hard disk device for backup. At a normal operation time, a main body of the computer is accessed by the volatile memory section, thereby realizing a high speed storage having a large capacity.

In such a semiconductor disk device, data are moved to the volatile memory section from the hard disk for backup at a power supply input time. At a power supply interruption time, the content of the volatile memory section, which is changed by an outer access, is saved on the hard disk device.

As a memory, which is used to realize the above-mentioned semiconductor disk, a volatile DRAM, and a volatile SRAM, and the like are employed at present in view of the capacity and the cost. Therefore, a rechargeable battery is provided to prevent data from being erased at an unexpected power supply interruption time. In a case where the power supply is unexpectedly interrupted, power is supplied from the rechargeable battery. Then, data stored in the volatile memory section are saved on the hard disk device.

As mentioned above, in such a semiconductor disk device, it is indispensable to provide the battery for saving data at an emergent time. In many cases, the rechargeable battery is used to prevent the battery itself from being consumed. Then, the rechargeable battery is designed to be charged at the power supply input time.

However, in a conventional semiconductor disk device, data writing must be limited, depending on the state of the battery. Moreover, the following disadvantages (1) to (4) are present since data are written to the volatile memory during the normal operation.

(1) When the battery is troubled, data saving cannot be ensured at a power failure time. Due to this, data writing to the semiconductor disk device must be prohibited.

(2) For the same reason as stated in item (1), data writing to the semiconductor disk device must be prohibited at the power supply input time until the battery is charged.

(3) Since data, which is obtained during the operation, are erased from the memory when the semiconductor disk device is troubled, data regarding failure analysis cannot be obtained.

(4) When the volatile memory section is troubled, data cannot be recovered.

SUMMARY OF THE INVENTION

An object of the present invention is to provide a semiconductor disk device, which operates as a storage even if a battery is unusable, so as to ensure a writing content, and its data storing method.

The other object of the present invention is to provide a semiconductor disk device, which can restore data stored in a hard disk device even if failure is generated in a part of the function of the device.

According to a first aspect of the present invention, there is provided a semiconductor disk device for storing or outputting data in accordance with a write request from an outer unit or a read request comprising a volatile memory for writing input data from the outer unit and for storing data to be read in the outer unit; a battery for supplying power to the semiconductor disk device when a power supply of the semiconductor disk device is interrupted; nonvolatile storing means for outputting initially stored data to the volatile memory when the power supply is input, and operating with power supplied from the battery when the power supply is interrupted, thereby storing data stored in the volatile memory to save the stored data; detecting means for detecting whether or not the battery can supply power; and a write-through setting means for changing a write-path of the input data from the outer unit to a write-through path where the input data are written onto not only the volatile memory but also the storing means when it is detected by the detecting means that the battery cannot supply power.

According to the above-mentioned structure, when it is detected that the battery is in the state that power cannot be supplied, the input data from the outer unit can be written as follows.

More specifically, input data can be written onto not only the high-speed volatile memory, which is used only at the operation time, but also the nonvolatile storing means, which is used as data storing means after the power supply interruption. Therefore, input data after the unusable state of the battery can be surely backed up in the nonvolatile storage after the battery is in the unusable state.

In addition to the above structure, the above-structured semiconductor disk device further comprises data saving means for storing data stored in the volatile memory into the storing means to save data when it is detected by the detecting means that the battery cannot supply power.

Therefore, according to the above-mentioned structure, when it is detected that the battery is in the state that power cannot be supplied, data, which are stored in the volatile storage, can be saved into the nonvolatile storage from the high-speed volatile memory, which is used at only the operation time. Due to this, even if the power supply is interrupted after the battery unusable state, data stored in the volatile memory can be surely backed up.

According to a second aspect of the present invention, there is provided a semiconductor disk device for storing or outputting data in accordance with a write request from an outer unit or a read request comprising a volatile memory for writing input data from the outer unit and for storing data to be read in the outer unit; a battery for supplying power to the semiconductor disk device when a power supply of the semiconductor disk device is interrupted; operation checking means for checking an operation state of the semiconductor disk device so as to detect a generation of an error; a hard disk device outputting initially stored data to the volatile memory when the power supply is input, and operating with power supplied from the battery when the power supply is interrupted, the hard disk device having two or more storing areas for storing data where data stored in the volatile memory are stored to save data; and selecting means for selecting a storing area in the hard disk such that data are saved in the same storing area from the power supply input till the power supply interruption, and in the other storing area after a next power supply input.

Therefore, in the above-mentioned structure, data are sequentially saved into the plurality of the storing areas, and the backup for data of the plurality of generations can be stored in the hard disk device. Due to this, even if the failure is generated in the part of the device and data cannot be normally saved, data of the generation, which are normally saved, can be restored.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Embodiments of the present invention will be explained with reference to the drawings.

(First Embodiment)

Figure 1:
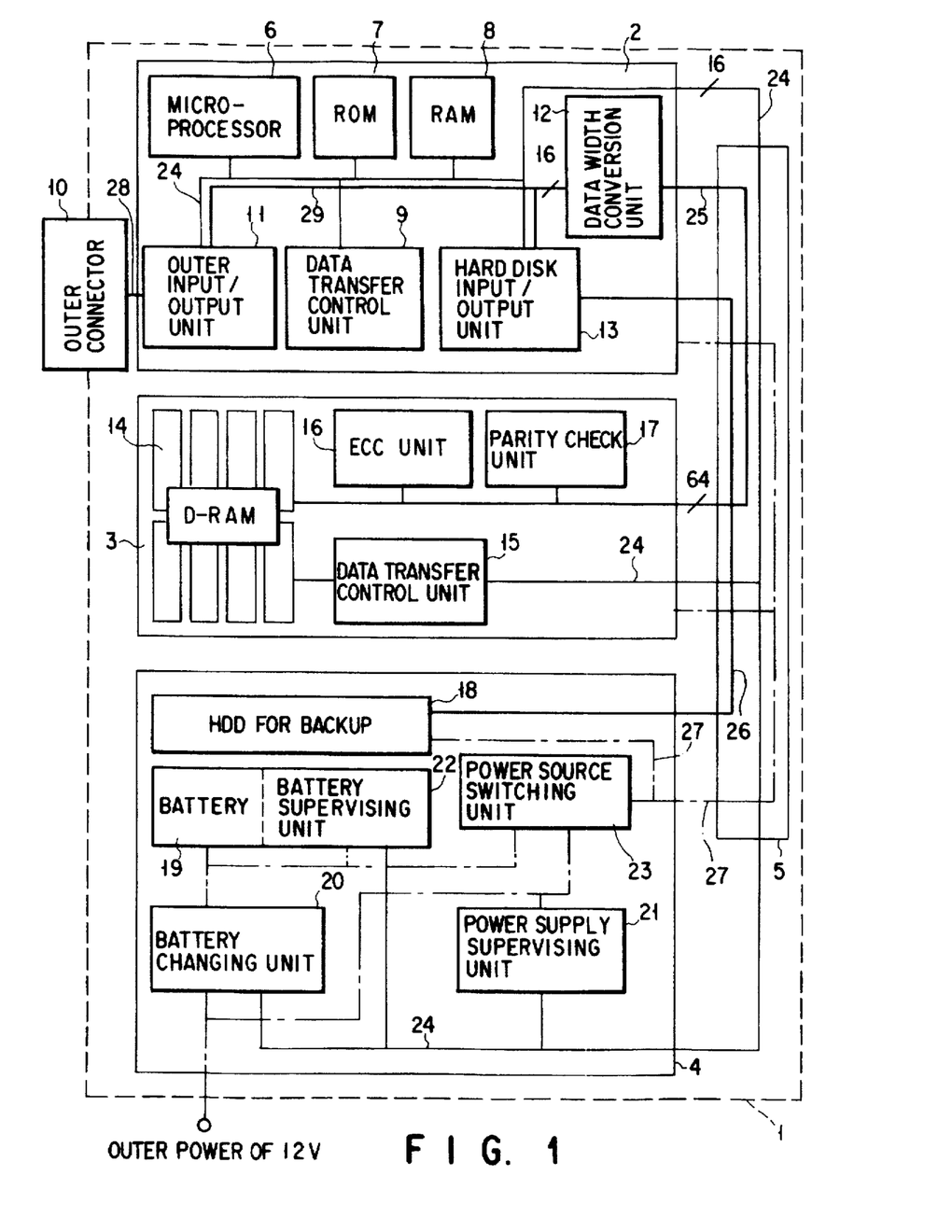
FIG. 1 is a structural view showing one example of a semiconductor disk device of a first embodiment of the present invention.

FIG. 1 is a structural view showing one example of a semiconductor disk device of a first embodiment of the present invention.

A semiconductor disk device 1 comprises a controller board 2, a semiconductor memory board 3, an HDD and power supply board 4, and a motherboard 5 for electrically connecting these boards to each other.

The controller board 2 controls the entire semiconductor disk device. The board 2 comprises a microprocessor 6, a firmware ROM 7, a work memory 8 having a RAM, a controller-side data transfer control unit 9, an outer connector 10, an outer input/output (I/O) unit 11, a data width conversion unit 12 accomplishing a 16 bit/64 bit data width conversion, and a hard disk I/O unit 13.

The semiconductor memory board 3 comprises a DRAM 14, serving as a volatile memory, a memory-side data transfer control unit 15, an EEC unit 16, and a parity check unit 17.

The DRAM 14 comprises 8 SIMMs (single in-line memory modules) having 128M bits.

The EEC unit 16 checks whether or not a data error of DRAM 14 occurs when an EEC bit is added to data.

The parity check unit 17 checks whether or not a data error occurs during data transfer.

The HDD power supply board 4 comprises a hard disk 18 for backup, a rechargeable battery 19, a battery charging unit 20, a power supply supervising unit 21, a battery supervising unit 22, and a power source switching unit 23.

The hard disk 18 is a nonvolatile storage for storing data when the power supply is interrupted.

The rechargeable battery 19, battery charging unit 20, power supply supervising unit 21, battery supervising unit 22, and power source switching unit 23 constitute a power supply unit.

Outer power of 12V is input to the battery charging unit 20, power supply supervising unit 21, and the power source switching unit 23.

The battery charging unit 20 is controlled by the microprocessor 6 through a supervisory/control line 24 for the microcomputer to charge the battery 19 from the outer power source.

Power is input to the battery supervising circuit 22 and the power source switching unit 23 from the battery 19. In this case, an input voltage is about 11V.

The power source switching unit 23 is structured to use power supplied from either a feeder of the outer power supply or a feeder of the battery 19. In the power source switching unit 23, a diode is provided in the feeder of each of the outer power source and the battery 19.

When there is no abnormality in the outer power supply of 12V, power is extracted from only the outer power source by the provision of the diode. Then, when outer power supply is turned off, power is extracted from the battery 19.

The power source switching unit 23 converts 12V or 11V of the power source to 5V so as to supply power to each section through a feeder 27.

The power supply supervising unit 21 and the battery supervising unit 22 supervise the outer power supply and the voltage of the battery 19, respectively. Then, information from each supervising unit is sent to the microprocessor 6 through the supervisory/control line 24. The battery supervising unit 22 also supervises temperature of the battery 19.

On the motherboard 5, the supervisory/control line 24, a semiconductor disk data line, an SCSI signal line 26 for backup HDD, and a feeder 27 are mounted. These lines are connected to the respective parts of the semiconductor disk device 1.

The microprocessor 6 supervises or controls the controller-side data transfer control unit 9, the outer I/O unit 11, the hard disk I/O unit 13, the memory-side data transfer control unit 15, the battery charging unit 20, the power supply supervising unit 21, and the battery supervising unit 22 in accordance with a control firmware stored in the firmware ROM 7. Thereby, the entire semiconductor disk device 1 is controlled.

The following will explain each part, which is operated by the control of the microprocessor 6.

The outer I/O unit 11 is an SCSI controller, which is connected to an outer computer through an outer data line 28, and the outer connector 10. Therefore, in the computer, the semiconductor disk device 1 can be used as a storage, which is operated based on an SCSI standard.

The control unit 9 and the control unit 15 execute a data transfer from the outer I/O unit 11 to the hard disk I/O unit 13 or the data width conversion unit 12, that is, data transfer through an inner data line 29. Also, the control unit 9 and the control unit 15 execute a data transfer from the data width conversion unit 12 to the DRAM 14, that is, data transfer through a semiconductor disk data line 25. The memory-side data transfer control unit 15 also operates as a control unit of the DRAM 14.

The hard disk I/O unit 13 is an SCSI controller. The unit 13 controls a data transfer from the unit 13 to the hard disk 18 for backup, that is, data transfer through the SCSI signal line 26 for backup HDD.

If the states of the outer power source and the battery 19 are normal, the microprocessor 6 controls each part of the semiconductor disk device 1. Each part is controlled such that a data transmission passes through the outer data line 28, the inner data line 29, and the semiconductor disk data line 25 can be used as a data writing path from the outer computer and a data reading path. These data paths are hereinafter referred to data paths at a normal operation time.

In this case, the computer inputs/outputs data to/from the DRAM 14 of the semiconductor disk device 1.

At the time of power supply of the semiconductor disk device 1, the microprocessor 6 controls the battery charging unit 20 so as to charge the battery 19. Thereafter, data is read from the hard disk 18 for backup so as to be written to the DRAM 14.

Conversely, at the power supply interruption time of the outer power source, the microprocessor 6 detects a voltage drop of the outer power source based on the result of the supervision notified from the power supply supervising unit 21. Then, data of the DRAM 14 are stored in the hard disk 18 by use of power of the battery 19.

The microprocessor 6 executes some operations in accordance with the content of the firmware in addition to the above operations at the normal time.

Figure 2:
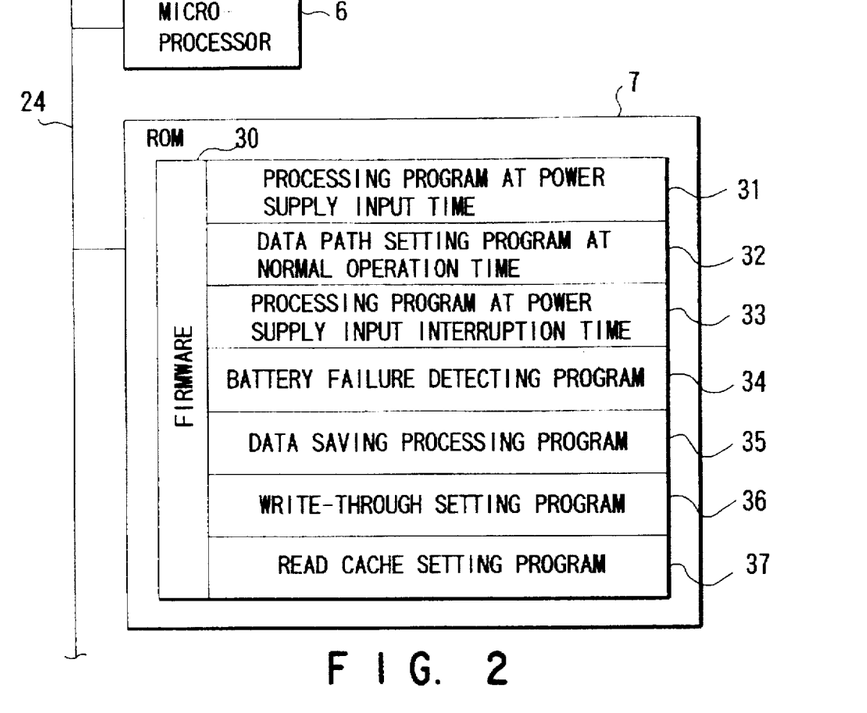
FIG. 2 is a block diagram showing the main structure of the semiconductor disk device of the first embodiment of the present invention.

FIG. 2 is a block diagram showing the main structure of the semiconductor disk device of the first embodiment of the present invention.

As shown in FIG. 2, as a program used in the microprocessor 6, the following programs are provided in the firmware 30 stored in the firmware ROM 7, in addition to a program for controlling a normal operation of the semiconductor disk device.

More specifically, there are provided a processing program 31 at a power supply input time, a data path setting program 32 at a normal operation time, a processing program 33 at a power supply input interruption time, a battery failure detecting program 34, a data saving processing program 35, a write-through setting program 36, and a read cache setting program 37.

The processing program 31, the setting program 32, and the processing program 33 are used to execute the above-mentioned operations at the normal time.

The microprocessor 6 supervises the state of the battery 19 through the battery supervising unit 22 to detect the voltage abnormality/temperature abnormality of the battery 19 based on the battery failure detecting program 34. Then, detected abnormality of the battery 19 is indicated to the program 35, the program 36, and the program 37 to execute an operation for saving data.

When the detected abnormality of the battery 19 is notified to the program 35, each data set of fixed-size stored in the DRAM is saved on the hard disk 18 based on the data saving processing program 35. If there is an access to the semiconductor disk device 1 before the data saving is completed, the access to the semiconductor disk device is first executed based on the write-through setting program 36 and the read cache setting program 37.

The above data saving is executed through the semiconductor data line 25, the inner data line 29, and the SCSI signal line 26 for backup HDD.

On receiving a data write request from the outer I/O unit 11, the microprocessor 6 controls a data reading operation from the outer I/O unit 11 and a data writing operation to storing means based on the write-through setting program 36 as follows.

More specifically, input data are written onto the DRAM 14 through the outer data line 28, the inner data line 29, and the semiconductor disk data line 25. Thereafter, data are read out from the DRAM 14 so as to be written onto the hard disk 18 through the semiconductor disk data line 25, the inner data line 29, and the SCSI signal line 26. Then, the data writing operation is completed on completion of the data writing onto the hard disk 18. The writing operation is hereinafter referred to a write-through.

A data write path where input data are written to the DRAM 14 and the same data are further written to the hard disk 18 is referred to a write-through path. The write-through setting program 36 is used to change the write path of input data to the write-through path.

On receiving a data read request from the outer I/O unit 11, the microprocessor 6 reads data from the DRAM 14 to be output through the outer I/O unit 11 based on the read cache setting program 37. The reading operation is hereinafter referred to a read cache. The reading operation is the same as the operation based on the data path setting program 32 at the normal operation time.

Even after the write-through path is set, the data saving in response to a writing request of input data from the outer section is maintained by the combination of the write-through setting program 36 and the read cache setting program 37 until the power supply is interrupted. Also, the data output operation in response to a reading request of input data is maintained.

The following will explain an operation of the above-structured semiconductor disk device of the present invention.

If the power supply is input, the battery 19 is charged. Thereafter, data are read from the hard disk 18 so as to be saved in the DRAM 14.

Moreover, a data path at a normal time is set, an access from the outer computer to only the DRAM 14 is executed. In this case, the access to the DRAM 14 can be executed at high speed, thereby realizing the high-speed access to the semiconductor disk device 1 from the main body of the computer.

If the use of the computer is ended and the power supply is interrupted or the power supply is interrupted by abnormality of the outer power source, the content of the DRAM 14 is saved in the hard disk 18. Since the hard disk 18 is the nonvolatile storage, data are stored till a next use of the semiconductor disk device 1.

Figure 3:
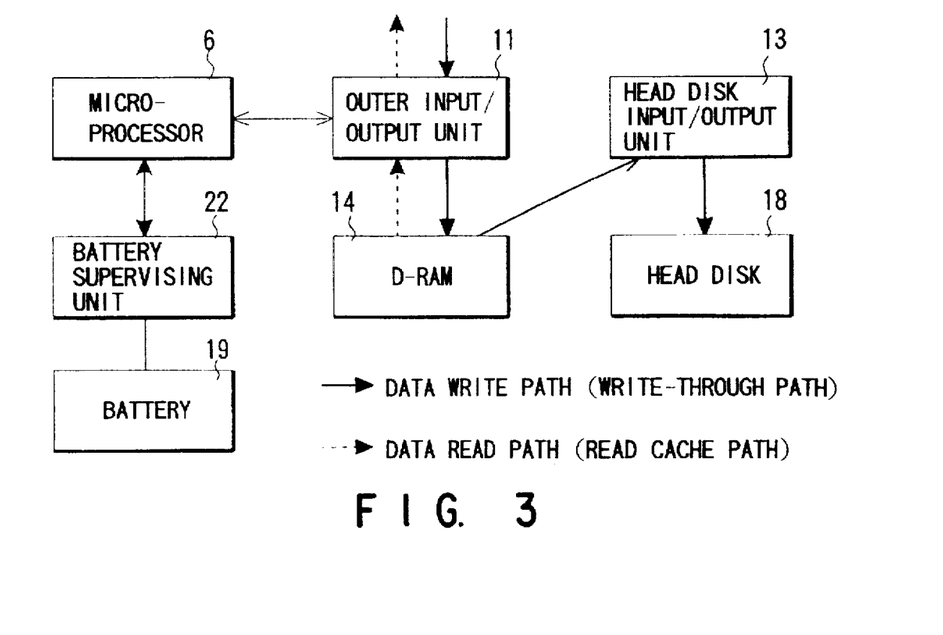
FIG. 3 is a view explaining an operation of the semiconductor disk device of the first embodiment of the present invention.

FIG. 3 will explain an operation when abnormality occurs in the battery 19 during the use of the semiconductor disk device.

First, the microprocessor 6 detects a voltage abnormality of the battery 19 or a temperature abnormality through the battery supervising unit 22. Then, the write-through path and the read cache are set, and each of fixed-size data set stored in the DRAM 14 is saved in the hard disk 18.

In this way, data writing path from the outer computer is formed to be a write-through, and data are written onto both DRAM 14 and hard disk 18. Due to this, even if the outer power supply input is suddenly interrupted after saving data to the hard disk 18 based on the data save processing program 35, the same data as the DRAM 14 is stored in the hard disk 18.

Moreover, since the data read path is a read cache, a high speed access of at least data reading can be executed, so that the high-speed access can be maintained to some extent.

As mentioned above, according to the semiconductor disk device of the first embodiment of the present invention, data can be written onto not only the DRAM 14 but also the hard disk 18 when abnormality of the battery 19 is detected by the battery supervising unit 22. Due to this, even if the battery 19 is unusable, the semiconductor disk device of the present invention can be operated as a storage. Thereby, the storage of the content of the writing can be ensured.

Therefore, even if the battery is troubled, the semiconductor disk device can be operated as a storage. Also, even if the power supply input is interrupted due to a power failure in this case, the content of the writing can be saved in the hard disk.

Moreover, as mentioned above, according to the semiconductor disk device of the first embodiment of the present invention, the content of the DRAM 14 is saved in the hard disk 18 based on the data save processing program 35 when abnormality of the battery 19 is detected by the battery supervising unit 22. Due to this, even if the power supply input is interrupted due to a power failure, the same data as data on the DRAM 14 can be surely stored in the hard disk 18.

Moreover, in saving data based on the data save processing program 35, each fixed-size data set is sequentially stored. However, if there is an access to the outer unit during the data save, the access to the outer unit is first executed. Due to this, generation of latency time to a request from the outer unit can be prevented. Therefore, data reliability of a semiconductor disk device 1 can be improved.

According to the present invention, even if the battery failure is generated, the user can continue to use the semiconductor disk device without considering the state of the battery. Due to this, it is unnecessary to immediately stop the continuous operation, so that the semiconductor disk device can be smoothly used.

For example, by use of the semiconductor disk device of the present invention, even at a battery failure generation time, the battery may be replaced with a new battery or the device may be repaired after an emergent work is ended. Therefore, workability can be improved.

The above embodiment explained that the access to the outer unit was executed prior to the data saving. However, the access to the outer unit may be executed after all data on the DRAM 14 is first saved. In this case, the reliable data saving can be improved.

(Second Embodiment)

The hardware structure of the semiconductor disk device of the second embodiment is the same as that of the first embodiment. The explanation of the portions of the second embodiment which are common to those of the first embodiment will be omitted. The following will explain only the portions, which are different from the first embodiment.

Figure 4:
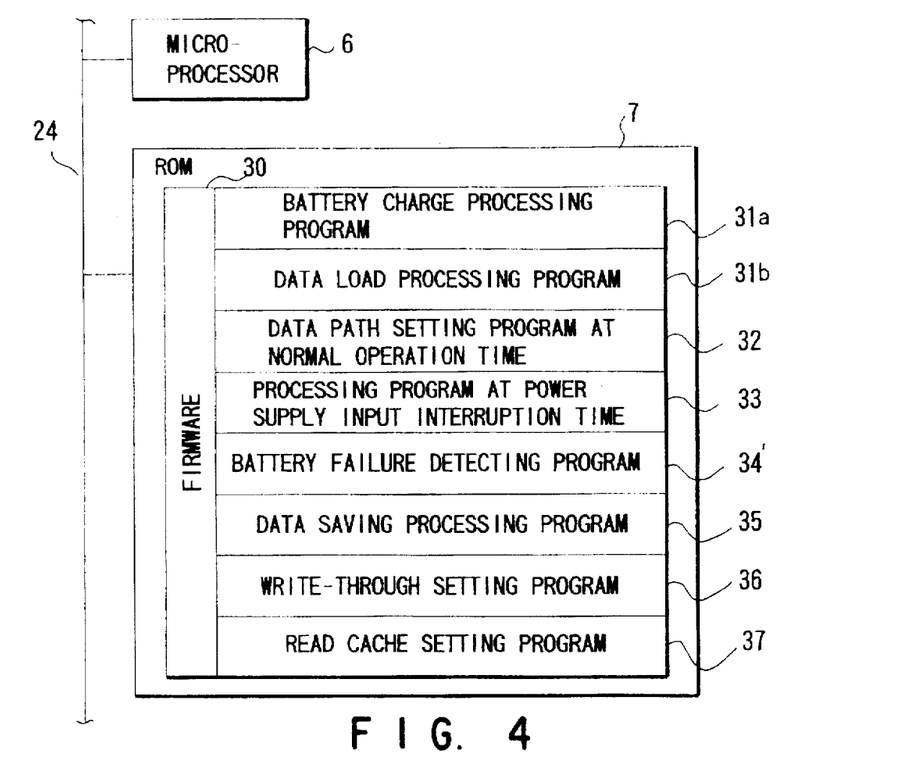
FIG. 4 is a block diagram showing the main structure of the semiconductor disk device of a second embodiment of the present invention.

FIG. 4 is a block diagram showing the main structure of the semiconductor disk device of the second embodiment of the present invention. The same reference numerals as FIG. 2 are added to the portions, which are common to FIG. 2, and their explanation will be omitted.

As shown in FIG. 4, in the firmware 30, there are provided a battery charge processing program 31a, a data load processing program 31b, the data path setting program 32 at a normal operation time, the processing program 33 at a power supply input interruption time, a battery failure detecting program 34', the data saving processing program 35, the write-through setting program 36, and the read cache setting program 37.

The microprocessor 6 controls the battery charge unit 20 so as to charge the battery 19 based on the battery charge processing program 31a.

At a power supply input time, the microprocessor 6 loads data from the hard disk 18 onto the DRAM 14 through the SCSI signal line 26, the inner data line 29, and the semiconductor disk data line 25 (hereinafter referred to as a data load path) regardless of the charging state of the battery 19 based on the data load processing program 31b. There are many cases in which the battery 19 is not sufficiently charged at the power supply input time. Due to this, an operation, which is based on the battery failure detecting program 34', is executed. In this case, the write-through path and the read cache path are set.

The battery failure detecting program 34' is formed to execute the same operation as the battery failure detecting program 34 of the first embodiment. In addition, for example, when the battery 19 is returned to the normal state due to the completion of the charging, the microcomputer 6 releases the write-through path and the read cache path. Then, the microcomputer 6 executes the data path setting program 32 at a normal operation time to set the data path.

Figure 5:
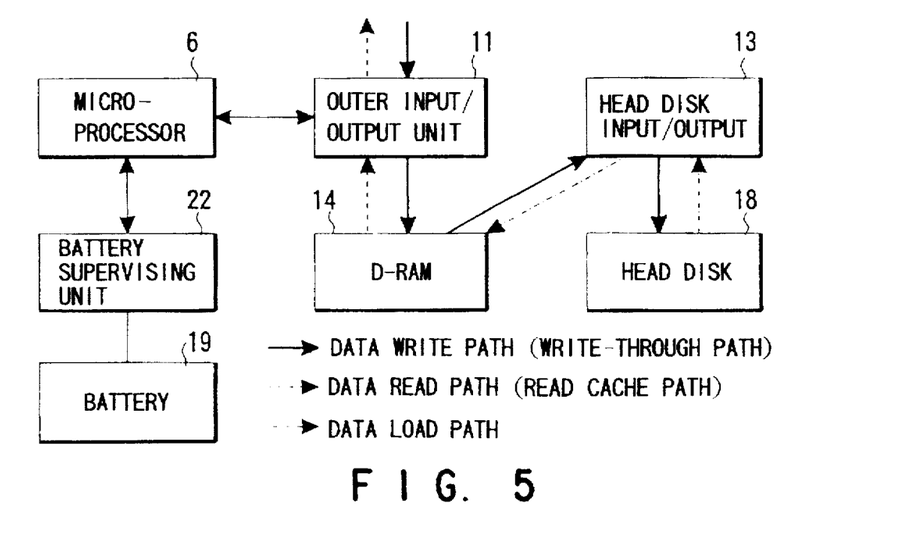
FIG. 5 is a view explaining an operation of the semiconductor disk device of the second embodiment of the present invention.

FIG. 5 is a view explaining an operation of the above-structured semiconductor disk device.

At the power supply input time, the microprocessor 6 loads data from the hard disk 18 onto the DRAM 14 through the data load path regardless of the charging state of the battery 19.

The microprocessor 6 reads the charging state of the battery 19 from the battery supervising unit 22. In a case where the battery 19 is insufficiently charged, the microprocessor 6 controls the battery 19 to be charged, and completes the data writing through the write-through.

Thereafter, if the charging is completed, the information is sent to the data path setting program 32 at a normal operation time based on the battery failure detecting program 34'. Moreover, the write-through and the read cache path are released, so that the data path at the normal operation time is set. In this way, the operation of the semiconductor disk device is returned to the normal state.

On the other hand, in a case where the battery 19 is sufficiently charged, the microprocessor 6 writes data, serving as a data path at the normal operation time, onto the DRAM 14, and completes the data writing through the write-through.

In either case, the reading operation is performed by the DRAM 14.

Thereby, the semiconductor disk device 1 can be used immediately after the power supply input regardless of the state of the battery 19.

As mentioned above, according to the present invention, data are transferred to the DRAM 14 based on the data load process program 31b regardless of the state of the battery 19 at the power supply input. Thereby, the access to the outer unit can be started. Then, if the charging is insufficient, the write-through pass is set. After the completion of the charging, the data path at the normal operation time can be set. Therefore, the same advantage as the case of the first embodiment can be obtained. Moreover, data at the power failure time can be ensured even if the charging of the battery is insufficient, so that wait time for the completion of the charging of the battery is not needed.

For example, in the conventional semiconductor disk device using the charging battery, the user must wait for about one hour was needed until the charging of the battery was completed. In other words, the user was not able to use the semiconductor disk device until the display showing the charging disappeared. According to the present invention, the backup for writing data can be compensated. Due to this, the semiconductor disk device can be used immediately after the power supply input without showing such a wait display, thereby improving workability.

(Third Embodiment)

The hardware structure of the semiconductor disk device of the third embodiment is the same as that of the first embodiment. The explanation of the portions of the third embodiment which are common to those of the first embodiment will be omitted. The following will explain only the portions which are different from the first embodiment.

Figure 6:
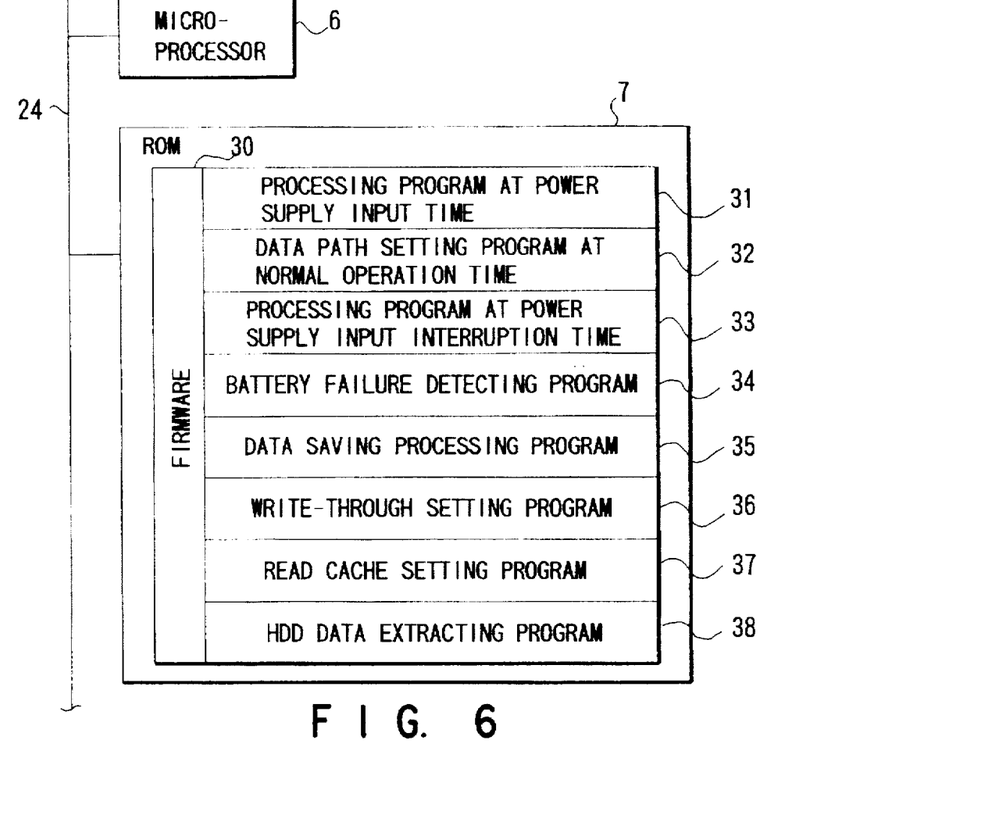
FIG. 6 is a block diagram showing the main structure of the semiconductor disk device of a third embodiment of the present invention.

FIG. 6 is a block diagram showing the main structure of the semiconductor disk device of the third embodiment of the present invention. The same reference numerals as FIG. 2 are added to the portions, which are common to FIG. 2, and their explanation will be omitted.

As shown in FIG. 6, in the firmware 30 stored in the firmware ROM 7, there are provided the processing program 31 at a power supply input time, the data path setting program 32 at a normal operation time, the processing program 33 at a power supply input interruption time, the battery failure detecting program 34, the data saving processing program 35, the write-through setting program 36, the read cache setting program 37, and an HDD data extracting program 38.

The microprocessor 6 sets the data read path based on the HDD data extracting program 38 such that data are output to the outer unit through the SCSI signal line 26, the inner data line 29, and the outer data line 28 (hereinafter referred to an HDD read path).

Figure 7:
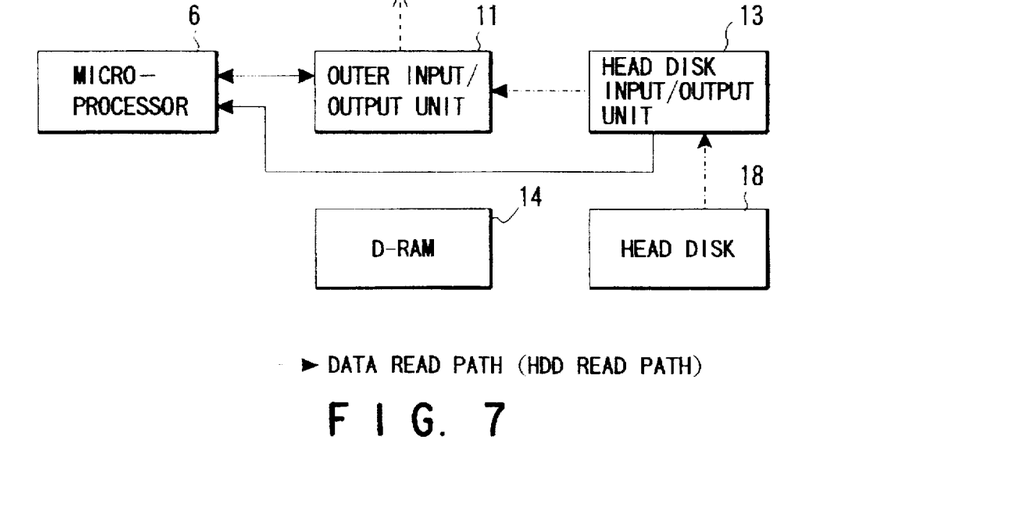
FIG. 7 is a view explaining an operation of the semiconductor disk device of the third embodiment of the present invention.

The following will explain an operation of the above-structured semiconductor disk device 1 with reference to FIG. 7.

For example, there is a case in which data of the DRAM 14 cannot be read due to reason of, e.g., trouble of the memory, in executing data reading to the semiconductor disk device 1.

In such a case, the outer unit can request data reading through the HDD read path.

The microprocessor 6 transfers data to the outer I/O unit 11 from the hard disk I/O unit 13 without passing through the hard disk 18 to the DRAM 14. Then, data are further transferred to the outer unit.

As mentioned above, according to the semiconductor disk device of the above-mentioned embodiment, the outer unit can request data reading through the HDD read path. Therefore, the same advantage as the first embodiment of the present invention can be obtained. In addition, at the time of the generation of memory failure, data stored in the hard disk can be picked up so as to be recovered.

(Fourth Embodiment)

The hardware structure of the semiconductor disk device of the fourth embodiment is the same as that of the first embodiment. The explanation of the portions of the fourth embodiment which are common to those of the first embodiment will be omitted. The following will explain only the portions which are different from the first embodiment.

The capacity of the hard disk 18 in this embodiment is larger than that of the DRAM 14. In the hard disk 18, a DRAM data saving area and an operation failure data save area are formed.

Figure 8:
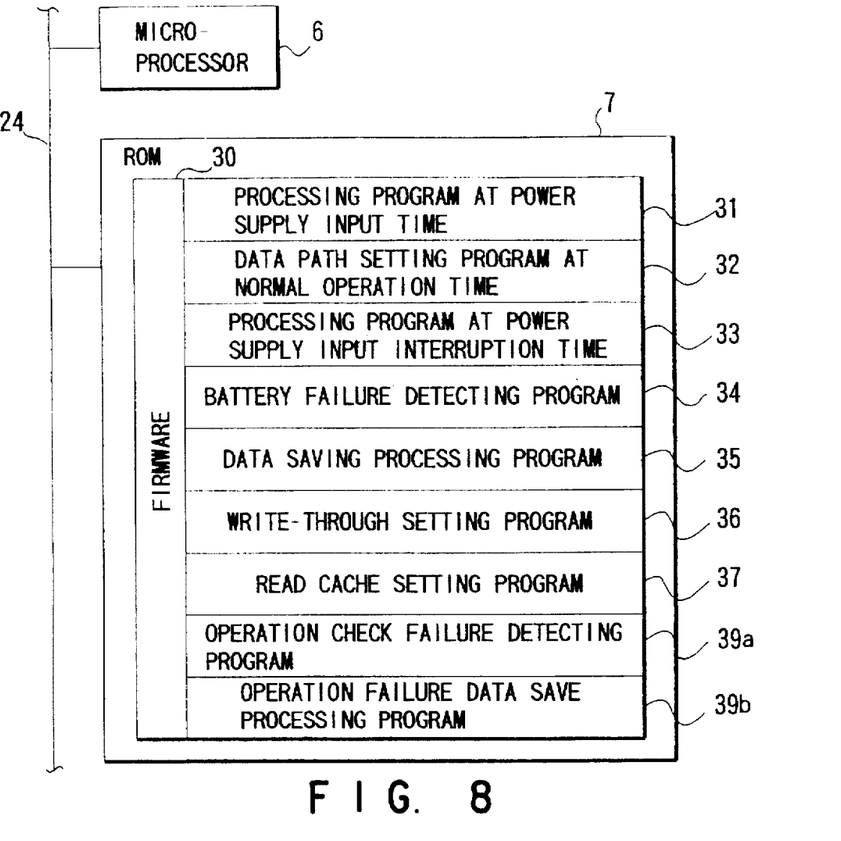
FIG. 8 is a block diagram showing the main structure of the semiconductor disk device of a fourth embodiment of the present invention.

FIG. 8 is a block diagram showing the main structure of the semiconductor disk device of the fourth embodiment of the present invention. The same reference numerals as FIG. 2 are added to the portions, which are common to FIG. 2, and their explanation will be omitted.

As shown in FIG. 8, in the firmware 30 stored in the firmware ROM 7, there are provided the processing program 31 at a power supply input time, the data path setting program 32 at a normal operation time, the processing program 33 at a power supply input interruption time, the battery failure detecting program 34, the data saving processing program 35, the write-through setting program 36, the read cache setting program 37, an operation check failure detecting program 39a, and an operation failure data save processing program 39b.

The microprocessor 6 checks the operation of the semiconductor disk device 1 (including the operation of the microprocessor 6 itself) at the normal operation time based on the operation check failure detecting program 39a. Thereby, generation of an error, e.g., an error generated in the I/O unit 11 or the hard disk I/O unit 13, or an error generated in the EEC unit 16 or the parity check unit 17, is detected so as to be stored in a work memory 8.

Unlike the detection of the battery failure based on the battery failure detecting program 34, the failure, which is generated during the operation of the device, is detected based on the operation check failure detecting program 39a.

The microprocessor 6 controls data, which are detected based on the operation check failure detecting program 39a and temporarily stored in the work memory 8, to be stored to the hard disk 18 based on the operation failure data save processing program 39b. Thereby, data, which are necessary to grasp the state of the device at the failure time, can be left.

Figure 9:
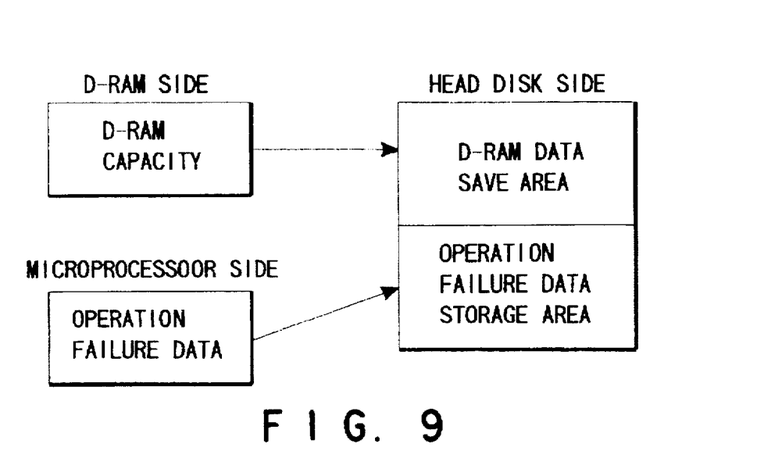
FIG. 9 is a view explaining an operation of the semiconductor disk device of the fourth embodiment of the present invention.

As mentioned above, according to the semiconductor device of the fourth embodiment, the operation failure data saving area is provided in the hard disk 18 so that data, which are necessary to grasp the state of the device at the failure time, can be left. Therefore, the same advantage as the first embodiment of the present invention can be obtained. In addition, in the case of the generation of failure, specific data, which is necessary to analyze the failure, can be obtained.

(Fifth Embodiment)

The hardware structure of the semiconductor disk device of the fifth embodiment is the same as that of the first embodiment. The explanation of the portions of the fifth embodiment, which are common to those of the first embodiment will be omitted. The following will explain only the portions which are different from the first embodiment.

In this embodiment, the capacity of the hard disk 18 is two or more times greater than that of the DRAM 14. In the hard disk 18, two DRAM data save areas are provided.

Figure 10:
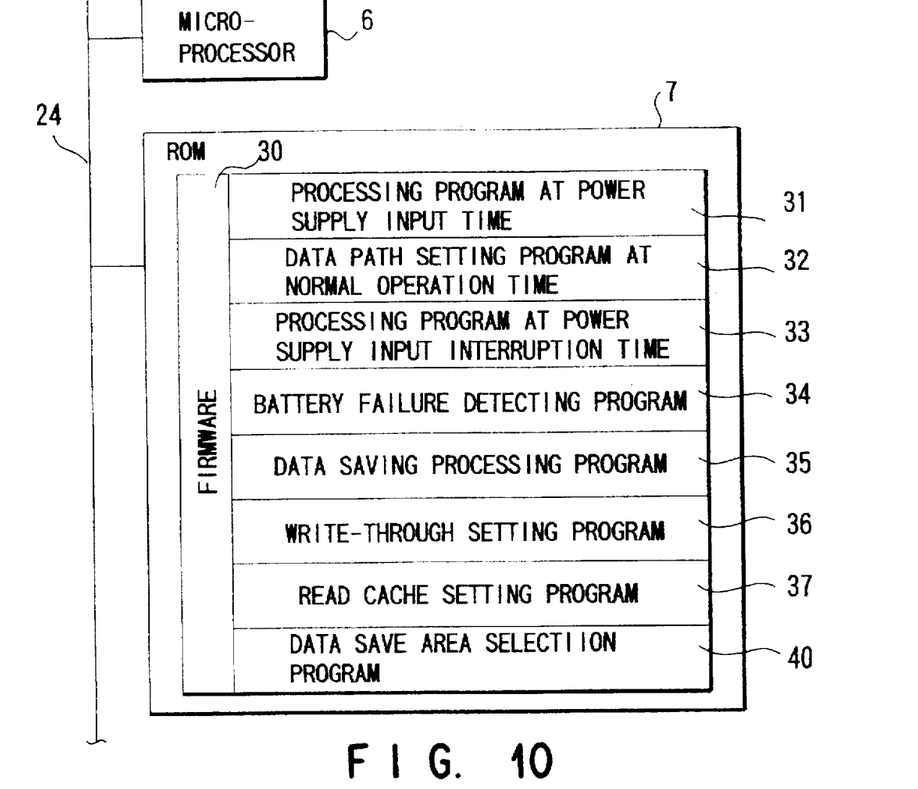
FIG. 10 is a block diagram showing the main structure of the semiconductor disk device of a fifth embodiment of the present invention.

FIG. 10 is a block diagram showing the main structure of the semiconductor disk device of the fifth embodiment of the present invention. The same reference numerals as FIG. 2 are added to the portions, which are common to FIG. 2, and their explanation will be omitted.

As shown in FIG. 10, in the firmware 30 stored in the firmware ROM 7, there are provided the processing program 31 at a power supply input time, the data path setting program 32 at a normal operation time, the processing program 33 at a power supply input interruption time, the battery failure detecting program 34, the data saving processing program 35, the write-through setting program 36, the read cache setting program 37, and a data save area selection program 40.

Figure 11:
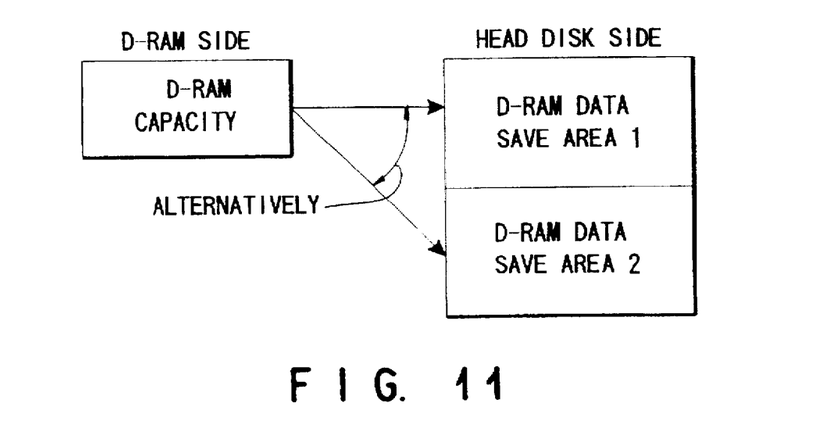
FIG. 11 is a view explaining an operation of the semiconductor disk device of the fifth embodiment of the present invention.

In executing the data save based on the processing program 33 or 35, the microprocessor 6 alternatively selects data save areas 1 and 2 of FIG. 11 based on the data save area selection program 40.

Figure 12:
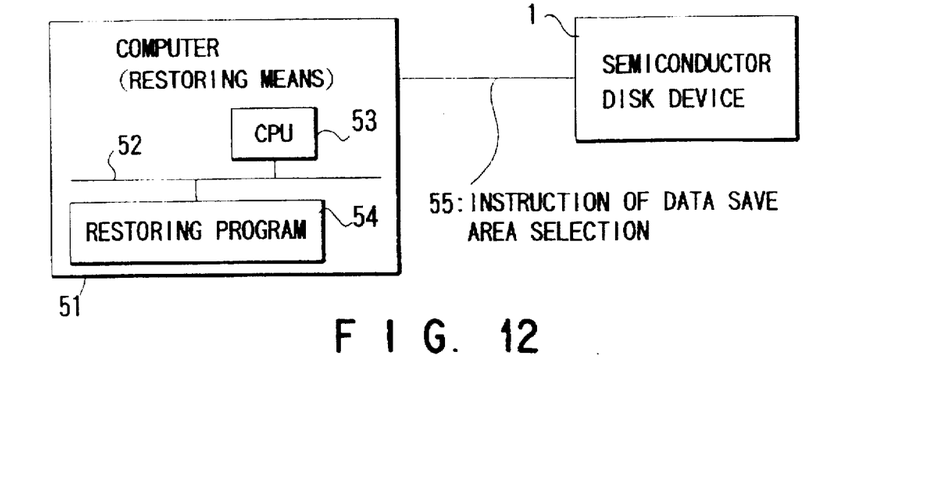
FIG. 12 is a view showing a state that data are restored in the semiconductor disk device of the fifth embodiment of the present invention.

As shown in FIG. 12, the semiconductor disk device 1 is connected to a computer 51, means for restoring saved data is provided in the computer 51.

In other words, a CPU 53 and a program memory 54 are connected to a bus 52, and a restore program is stored in the program memory 54.

In a case where any failure is generated at a data saving time and the data saving cannot be executed, the computer 51 executes the following operation.

More specifically, the computer 51 selects one of data saving areas 1 and 2 where the normal data saving is performed by the CPU 53, which is operated based on the restore program.

In other words, the computer 51 outputs a data saving area selection command to the semiconductor disk device 1 at the data saving time.

In the above-structured semiconductor disk device, the data saving areas 1 and 2 are alternatively used in saving data to the DRAM 14 as shown in FIG. 11.

First of all, when the power supply is input, data is read from the data saving area 1 or 2, which was backed up at the previous power supply interruption, based on the data saving area selection program 40.

Next, for backing up the content of the DRAM 14 to the HDD 18 due to the operation of the power supply interruption or the generation of the battery failure, data is stored in the following area.

More specifically, the data storage area is different from the area, which is read this time. Then, data is stored based on the data saving area selection program 40.

In a case where the write-through is set at the battery failure generation time, the write-through is executed to the same data saving area till the power supply interruption of the main body of the device. Therefore, even if data fail to be saved, data can be restored to one previous data generation based on an instruction from the computer 51.

As mentioned above, according to the semiconductor device of the fifth embodiment, the capacity of the hard disk 18 is two or more times greater than that of the DRAM 14. In the hard disk 18, two DRAM data save areas are provided. These areas are alternatively used. Due to this, the same advantage as the first embodiment of the present invention can be obtained. In addition, even if some failure is generated in saving data at the power failure time and data fail to be saved, data can be restored to data of one previous generation.

Therefore, even if the battery is insufficiently charged and the battery is not correctly operated, data can be recovered to a certain level. Thereby, reliability of stored data can be improved.

(Sixth Embodiment)

The hardware structure of the semiconductor disk device of the sixth embodiment is the same as that of the first embodiment. The explanation of the portions of the sixth embodiment which are common to those of the first embodiment will be omitted. The following will explain only the portions which are different from the first embodiment.

In this embodiment, the capacity of the hard disk 18 is N times or more greater than that of the DRAM 14. In the hard disk 18, N DRAM data save areas are provided.

Figure 13:
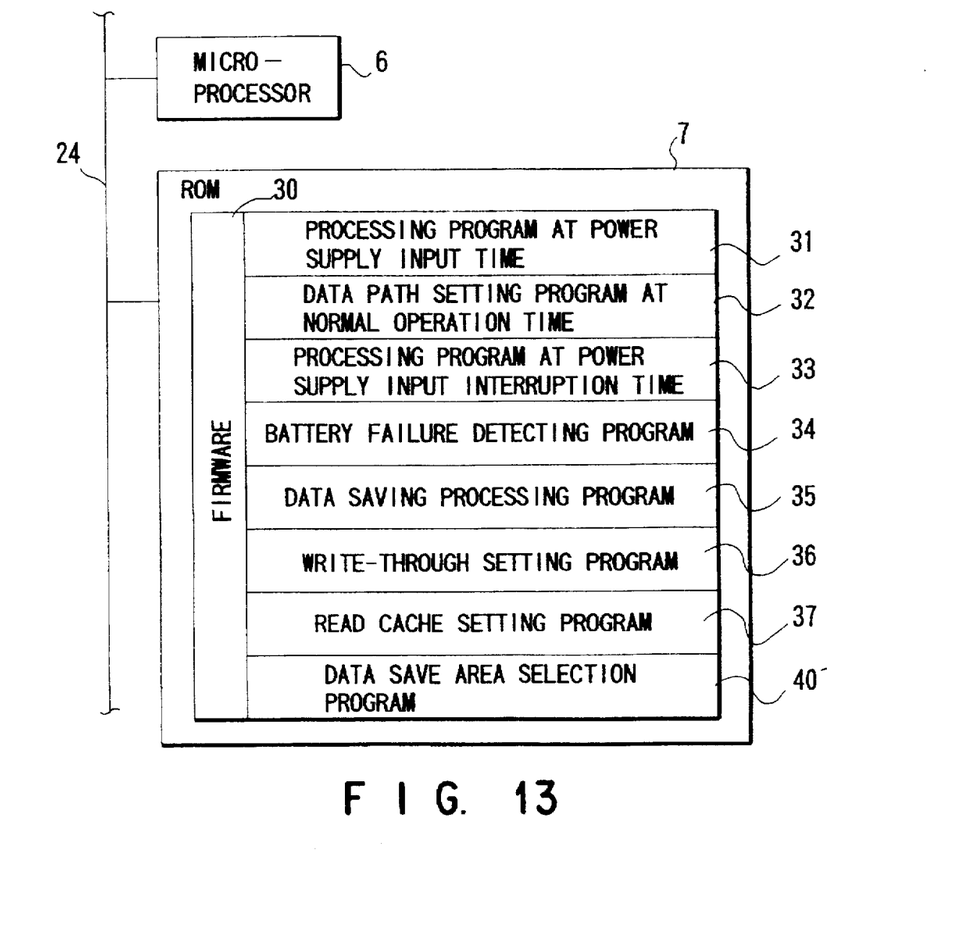
FIG. 13 is a block diagram showing the main structure of the semiconductor disk device of a sixth embodiment of the present invention.

FIG. 13 is a block diagram showing the main structure of the semiconductor disk device of the sixth embodiment of the present invention. The same reference numerals as FIG. 2 are added to the portions, which are common to FIG. 2, and their explanation will be omitted.

As shown in FIG. 13, in the firmware 30 stored in the firmware ROM 7, there are provided the processing program 31 at a power supply input time, the data path setting program 32 at a normal operation time, the processing program 33 at a power supply input interruption time, the battery failure detecting program 34, the data saving processing program 35, the write-through setting program 36, the read cache setting program 37, and a data save area selection program 40'.

Figure 14:
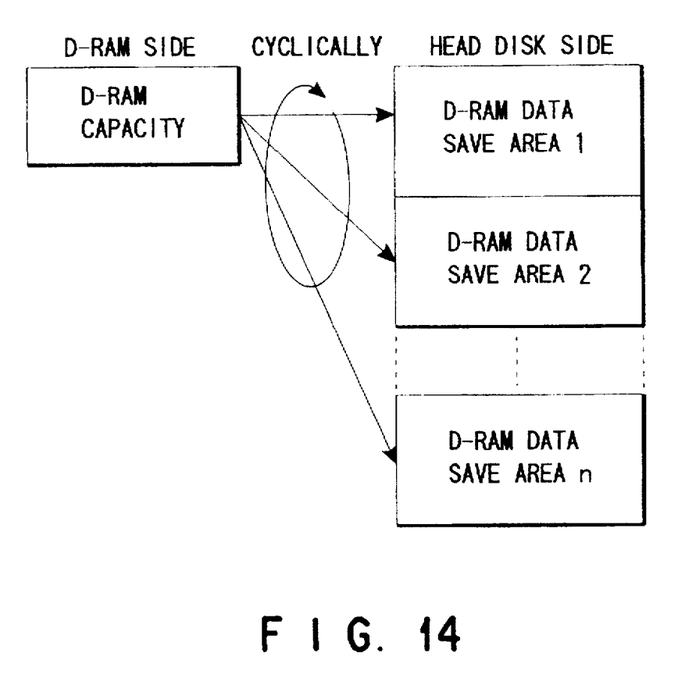
FIG. 14 is a view explaining an operation of the semiconductor disk device of the sixth embodiment of the present invention.

In saving data based on the processing program 33 or the data saving processing program 35, the microprocessor 6 cyclically selects data save areas 1 to N of FIG. 14 in order based on the data save area selection program 40'.

Unlike the data save area selection of the fifth embodiment, the data save area is cyclically selected in the sixth embodiment.

Similar to the case of the fifth embodiment, in the semiconductor disk device of this embodiment, data can be restored based on an instruction from the computer 51 as shown in FIG. 12. In this case, the newest data save area is selected among the data save areas, which are normally stored.

In the above-structured semiconductor disk device, the data save areas 1 to N of the hard disk 18 are cyclically selected, so that data of N previous generations can be stored.

Also, even if data fails to be saved, data can be restored to data of N previous generations based on an instruction from the computer 51.

According to the semiconductor disk device of the sixth embodiment, the capacity of the hard disk 18 is N times or more greater than that of the DRAM 14. In the hard disk 18, N DRAM data save areas are provided. Then, these areas are cyclically selected. Due to this, the same advantage as the first embodiment of the present invention can be obtained. In addition, data of N previous generations can be stored, and data can be restored to data of N previous generations.

Moreover, if the semiconductor disk device of the fourth embodiment is combined with that of the fifth or sixth embodiment, analysis data at a failure generation time can be obtained from each set of stored data. The state of the device at the failure generation time is reproduced based on the obtained analysis data so as to detect the cause of the failure generation.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor disk device for storing or outputting data in accordance with a write or read request from/to an outer unit, comprising:

a volatile memory for writing input data from the outer unit and for storing data to be read in the outer unit;

a battery for supplying power to said semiconductor disk device when a power supply of said semiconductor disk device is interrupted;

nonvolatile storing means for outputting initially stored data to said volatile memory when said power supply is input, and operating with power supplied from said battery when said power supply is interrupted, thereby storing data stored in said volatile memory to save said stored data;

detecting means for detecting whether or not said battery can supply power; and a write-through setting means for changing a write-path of said input data from the outer unit to a write-through path where said input data is written onto not only said volatile memory but also said storing means when it is detected by said detecting means that said battery cannot supply power.

2. The device according to claim 1, wherein said nonvolatile storing means comprises a hard disk device.

3. The device according to claim 2, wherein said detecting means checks an error of said battery, thereby detecting that said battery cannot supply power.

4. The device according to claim 1, further comprising:

writing means for writing said input data supplied from said outer unit to said volatile memory;

reading means for reading data stored in said volatile memory to said outer unit; and transferring means for transferring data from said volatile memory to said nonvolatile storing means, wherein said write-through setting means sets said write-through path such that said input data written onto said writing means is continuously transferred to said memory means by said transferring means.

5. The device according to claim 4, wherein said writing means and said reading means operate to store or output data in accordance with the write or read request from the outer unit even after said write-through path is set.

6. The device according to claim 1, further comprising:

means for maintaining a state of said semiconductor disk device to be able to receive the write request from the outer unit or the read request until said power supply is interrupted even after said write-through path is set.

7. The device according to claim 6, further comprising:

data saving means for storing data stored in said volatile memory in said storing means to save said data when it is detected by said detecting means that said battery cannot supply power.

8. The device according to claim 7, wherein said data saving means divides said stored data into fixed-sized data so as to be stored in said storing means, respectively.

9. The device according to claim 8, wherein said data saving means for executing an operation in response to the write request from an outer unit or the read request prior to the continuous data saving to said storing means from said volatile memory when there is the write request from the outer unit or the read request in course of the retaining data saving.

10. The device according to claim 7, wherein said battery is formed of a rechargeable battery.

11. The device according to claim 10, wherein said detecting means detects that said battery cannot supply power when said battery is insufficiently charged, and detects that said battery can supply power when said battery is sufficiently charged.

12. The device according to claim 11, further comprising:

write-through releasing means for releasing said write-through path so as to change the write-path of said input data such that said input data from said outer unit is written onto only said volatile memory when it is detected by said detecting means that said battery can supply power and said write-through path is set.

13. The device according to claim 12, further comprising:

initial setting means for designating said write-through setting means to change the write path of said input data to said write-through path so as to set a state of said semiconductor disk device to be able to receive the write or read request from/to said outer unit without waiting for completion of charging said battery.

14. The device according to claim 12, wherein said write-through setting means sets the write-through such that input data is written onto said volatile memory and said input data written onto the volatile memory is transferred to said storing means.

15. A semiconductor disk device for storing or outputting data in accordance with a write or read request from/to an outer unit, comprising:

a volatile memory for writing input data from the outer unit and for storing data to be read in the outer unit;

a battery for supplying power to said semiconductor disk device when a power supply of said semiconductor disk device is interrupted;

a hard disk device for outputting initially stored data to said volatile memory when said power supply is input, and operating with power supplied from said battery when said power supply is interrupted, thereby storing data stored in said volatile memory to save said stored data; and data extracting means for changing a read path of data to the outer unit to an HDD read path where data can be directly read from not said volatile memory but said hard disk device.

16. A semiconductor disk device for storing or outputting data in accordance with a write or read request from/to an outer unit, comprising:

a volatile memory for writing input data from the outer unit and for storing data to be read in the outer unit;

a battery for supplying power to said semiconductor disk device when a power supply of said semiconductor disk device is interrupted;

a hard disk device operating with power supplied from said battery when said power supply is interrupted; and operation checking means for checking an operation state of said semiconductor disk device so as to detect a generation of an error, wherein said hard disk device outputs initially stored data to said volatile memory when said power supply is input, and said hard disk device has a storing area for storing data where said data stored in said volatile memory is stored to save said data, and a storing area for operation/error data where said operation/error data obtained by said operation checking means is stored.

17. A semiconductor disk device for storing or outputting data in accordance with a write or read request from/to an outer unit, comprising:

a volatile memory for writing input data from the outer unit and for storing data to be read in the outer unit;

a battery for supplying power to said semiconductor disk device when a power supply of said semiconductor disk device is interrupted;

operation checking means for checking an operation state of said semiconductor disk device so as to detect a generation of an error;

a hard disk device outputting initially stored data to said volatile memory when said power supply is input, and operating with power supplied from said battery when said power supply is interrupted, said hard disk device having two or more storing areas for storing data where data stored in said volatile memory is stored to save said data; and selecting means for selecting a storing area in said hard disk such that data is saved in the same storing area from the power supply input till the power supply interruption, and in the other storing area after a next power supply input.

18. The device according to claim 17, wherein said selecting means cyclically selects said storing means.

19. The device according to claim 18, wherein each of said storing areas includes a storing area for operation/error data where said data said operation/error data obtained by said operation checking means is stored.

20. A computer system comprising:

a semiconductor disk device of claim 17; and selecting means for selecting a storing area where data is normally saved and the newest data is stored to be used as a storing area for outputting initially stored data to said volatile memory.

21. A method for storing input data in a semiconductor disk device for storing or outputting data in accordance with a write or read request from/to an outer unit, comprising the steps of:

outputting data to be initially stored to a volatile memory by nonvolatile storing means when a power supply of said semiconductor disk device is input;

writing input data from the outer unit onto said volatile memory;

reading data stored in said volatile memory to the outer unit;

detecting whether or not a battery for supplying power to said semiconductor disk device is in a state that power cannot be supplied when said power supply is interrupted;

changing a write path of said input data from the outer unit to a write-through path where said input data is written onto not only said volatile memory but also said storing means when it is detected that said battery cannot supply power;

saving data stored in said volatile memory to said storing means when said write-through path is set; and saving data stored in said volatile memory to said storing means when said power supply is interrupted and said battery can supply power.

* * * * *